(12) United States Patent
Balakrishnan et al.

(10) Patent No.: US 9,929,266 B2
(45) Date of Patent: Mar. 27, 2018

(54) METHOD AND STRUCTURE FOR INCORPORATING STRAIN IN NANOSHEET DEVICES

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/005,665

(22) Filed: Jan. 25, 2016

(65) Prior Publication Data
US 2017/0213911 A1    Jul. 27, 2017

(51) Int. Cl.
| | | |
|---|---|---|
| *H01L 21/336* | (2006.01) | |
| *H01L 29/78* | (2006.01) | |
| *H01L 29/165* | (2006.01) | |
| *H01L 29/06* | (2006.01) | |
| *H01L 29/04* | (2006.01) | |
| *H01L 21/02* | (2006.01) | |
| *H01L 29/66* | (2006.01) | |

(52) U.S. Cl.
CPC .... *H01L 29/7848* (2013.01); *H01L 21/02532* (2013.01); *H01L 29/045* (2013.01); *H01L 29/0649* (2013.01); *H01L 29/0665* (2013.01); *H01L 29/165* (2013.01); *H01L 29/66545* (2013.01); *H01L 29/66795* (2013.01); *H01L 29/785* (2013.01)

(58) Field of Classification Search
CPC ........... H01L 21/30608; H01L 29/0669; H01L 29/66636; H01L 29/7848
See application file for complete search history.

(56) References Cited

U.S. PATENT DOCUMENTS

| | | | | |
|---|---|---|---|---|
| 6,713,356 B1* | 3/2004 | Skotnicki | .......... | H01L 21/76264 257/E21.415 |
| 2010/0295127 A1* | 11/2010 | Cheng | ................. | H01L 29/1079 257/347 |
| 2011/0175063 A1* | 7/2011 | Sekaric | .................. | B82Y 10/00 257/38 |
| 2013/0216779 A1* | 8/2013 | Hofmeister | ............. | B29C 41/38 428/141 |

(Continued)

*Primary Examiner* — Meiya Li
*Assistant Examiner* — Peter M Albrecht
(74) *Attorney, Agent, or Firm* — Scully, Scott, Murphy & Presser, P.C.; Louis J. Percello, Esq.

(57) ABSTRACT

A semiconductor structure includes a plurality of stacked and suspended semiconductor nanosheets located above a semiconductor substrate. Each semiconductor nanosheet has a pair of end sidewalls that have a V-shaped undercut surface. A functional gate structure is located around the plurality of stacked and suspended semiconductor nanosheets, and a source/drain (S/D) semiconductor material structure is located on each side of the functional gate structure. In accordance with the present application, sidewall portions of each S/D semiconductor material structure are in direct contact with the V-shaped undercut surface of the end sidewalls of each of the semiconductor nanosheets.

11 Claims, 7 Drawing Sheets

(56) References Cited

U.S. PATENT DOCUMENTS

| | | | |
|---|---|---|---|
| 2013/0248948 A1* | 9/2013 | Ma | H01L 29/66636 257/288 |
| 2013/0256664 A1* | 10/2013 | Qin | H01L 21/823807 257/57 |
| 2015/0137193 A1* | 5/2015 | Cheng | H01L 29/7842 257/288 |
| 2015/0228735 A1* | 8/2015 | Zhong | H01L 29/66825 257/190 |
| 2015/0295084 A1* | 10/2015 | Obradovic | H01L 29/7845 257/347 |
| 2016/0020305 A1* | 1/2016 | Obradovic | H01L 29/7391 257/39 |
| 2017/0194479 A1* | 7/2017 | Lee | H01L 29/785 |

* cited by examiner

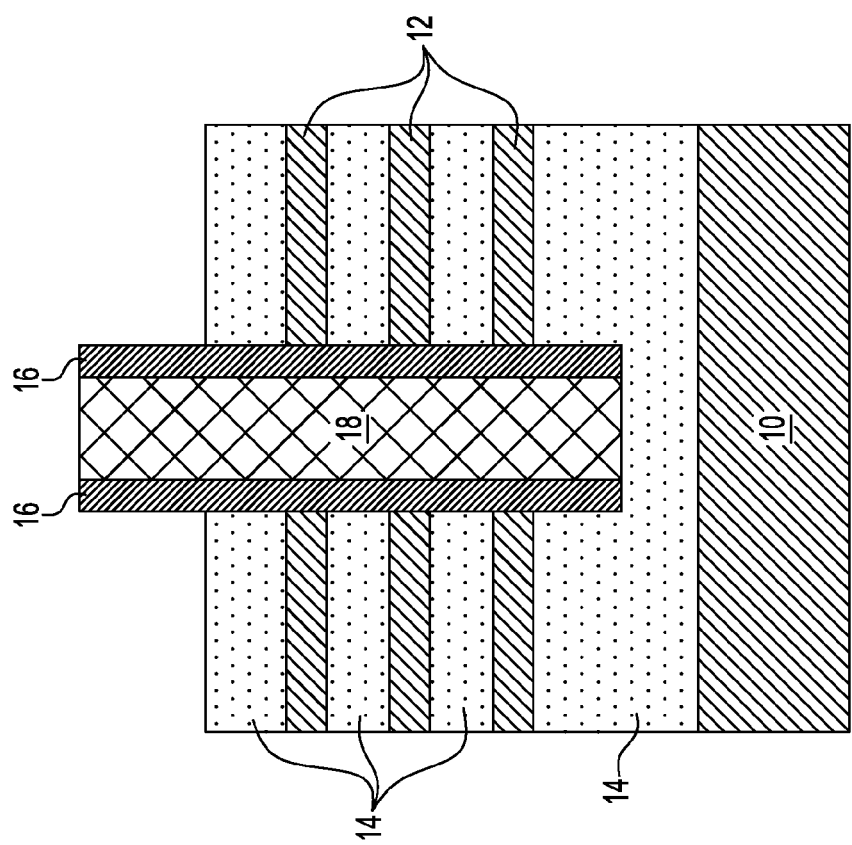

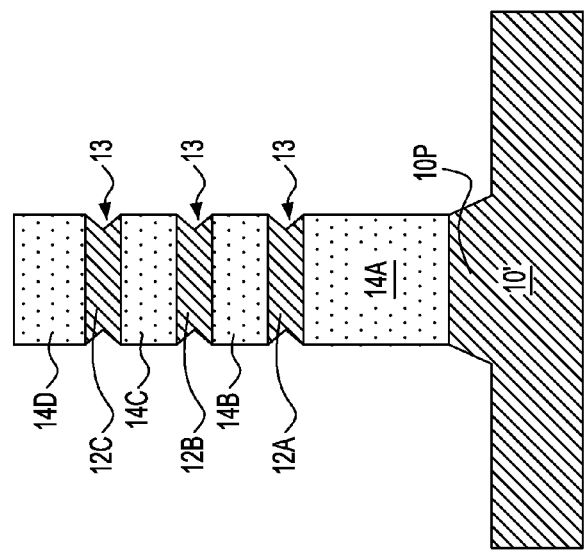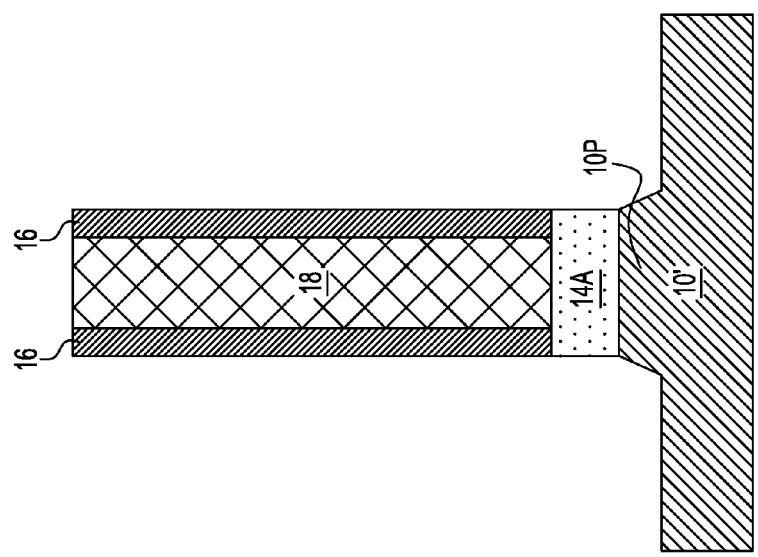
FIG. 3B
FIG. 3A

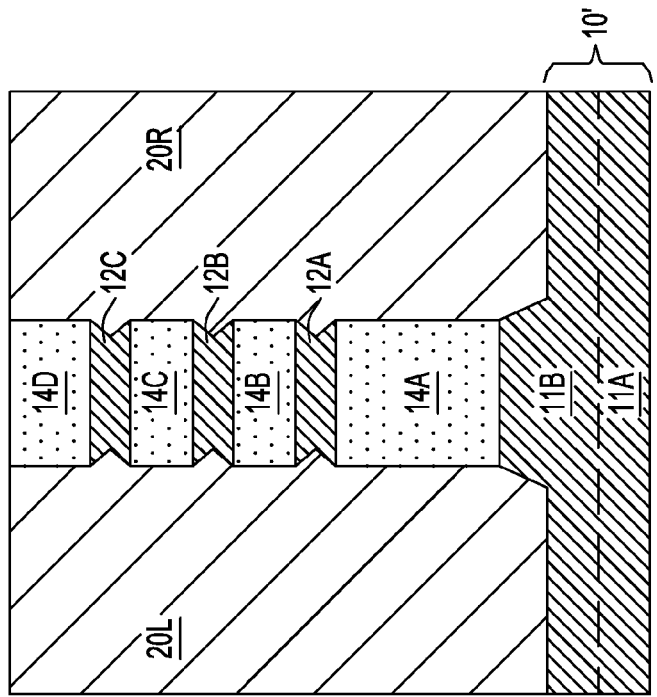
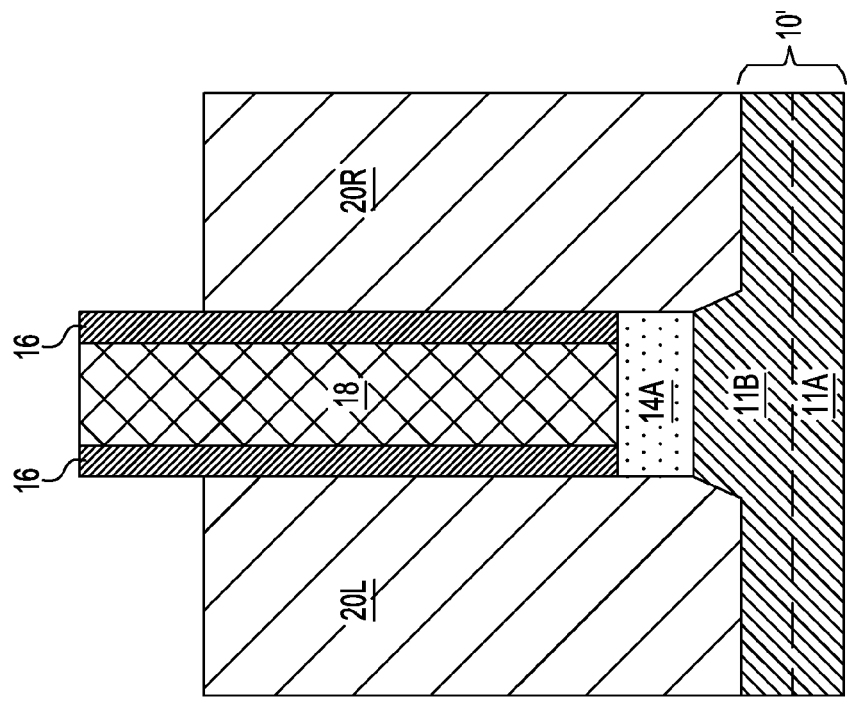
FIG. 4B
FIG. 4A

METHOD AND STRUCTURE FOR INCORPORATING STRAIN IN NANOSHEET DEVICES

BACKGROUND

The present application relates to semiconductor technology. More particularly, the present application relates to a semiconductor structure that includes a plurality of stacked and suspended semiconductor nanosheets, each semiconductor nanosheet having a pair of end sidewalls that have a V-shaped undercut surface. The present application also relates to a method of forming such a semiconductor structure.

The use of new semiconductor devices such as, for example, semiconductor fin field effect transistors (FinFETs) is the next step in the evolution of complementary metal oxide semiconductor (CMOS) devices. One type of new semiconductor device that has been touted as a viable option beyond the 7 nm technology node is nanosheet containing devices. By "nanosheet containing devices" it is meant that the device channel contains one or more layers of nanosheets. Each nanosheet has a vertical thickness that is substantially less than the width of each nanosheet. Gate structures are formed above and below each nanosheet. One challenge in fabricating nanosheet containing devices is the lack of a strain technique that can provide nanosheet containing devices with enhanced performance. Thus, there is a need for providing a nanosheet containing device in which strain can be incorporated into the nanosheet containing device.

SUMMARY

In one aspect of the present application, a semiconductor structure is provided. In one embodiment of the present application, the semiconductor structure may include a plurality of stacked and suspended semiconductor nanosheets located above a semiconductor substrate. In accordance with the present application, each semiconductor nanosheet has a pair of end sidewalls that have a V-shaped undercut surface. The semiconductor structure further includes a functional gate structure surrounding a portion of each semiconductor nanosheet of the plurality of stacked and suspended semiconductor nanosheets, and a source/drain (S/D) semiconductor material structure located on each side of the functional gate structure. In accordance with the present application, sidewall portions of each S/D semiconductor material structure are in direct contact with the V-shaped undercut surface of the end sidewalls of each semiconductor nanosheet.

In some embodiments, the V-shaped undercut surface provided to the end sidewalls of each semiconductor nano sheet can enhance strain and bring the dopants within each S/D semiconductor material structure closer to the device channel region, i.e., the portion of each semiconductor nanosheet that is surrounded by the functional gate structure. In some embodiments, each S/D semiconductor material structure may be grown from a surface of the semiconductor substrate that has a {100} crystallographic orientation. In such an embodiment, each S/D semiconductor material structure may have reduced epitaxy defect density and improved strain.

In another aspect of the present application, a method of forming a semiconductor structure is provided. In one embodiment of the present application, the method may include providing a material stack of alternating layers of dielectric portions and semiconductor material portions located on a surface of a semiconductor substrate, wherein a sacrificial gate structure and a gate spacer straddling over a portion of the material stack. Next, portions of the material stack not covered by the gate spacer and the sacrificial gate structure are removed to provide a stack of dielectric nanosheets and semiconductor nanosheets. A crystallographic orientation dependent etch is then performed on the stack to form semiconductor nanosheets having a pair of end sidewalls that have a V-shaped undercut surface. Next, a source/drain (S/D) semiconductor material structure is epitaxially grown on each side of the sacrificial gate structure and from the V-shaped undercut surface of the end sidewalls of each semiconductor nanosheet.

BRIEF DESCRIPTION OF SEVERAL VIEWS OF THE DRAWINGS

FIG. 1A is a cross sectional view of an exemplary semiconductor structure that includes a material sack of dielectric portions and semiconductor material portions located on a surface of a semiconductor substrate, wherein a sacrificial gate structure and a gate spacer straddling over a portion of the material stack.

FIG. 3A is a cross sectional view of the exemplary semiconductor structure of FIG. 2A after performing a crystallographic orientation dependent etch to form semiconductor nanosheets having a pair of end sidewalls that have a V-shaped undercut surface.

FIG. 3B illustrates the structure of FIG. 3A minus the gate spacer and the sacrificial gate structure.

FIG. 4A is a cross sectional view of the exemplary semiconductor structure of FIG. 3A after epitaxially growing a source/drain (S/D) semiconductor material structure on each side of the sacrificial gate structure and from the V-shaped undercut surface of each semiconductor nanosheet.

FIG. 4B illustrates the structure of FIG. 4A minus the gate spacer and the sacrificial gate structure.

DETAILED DESCRIPTION

Figure 1B:
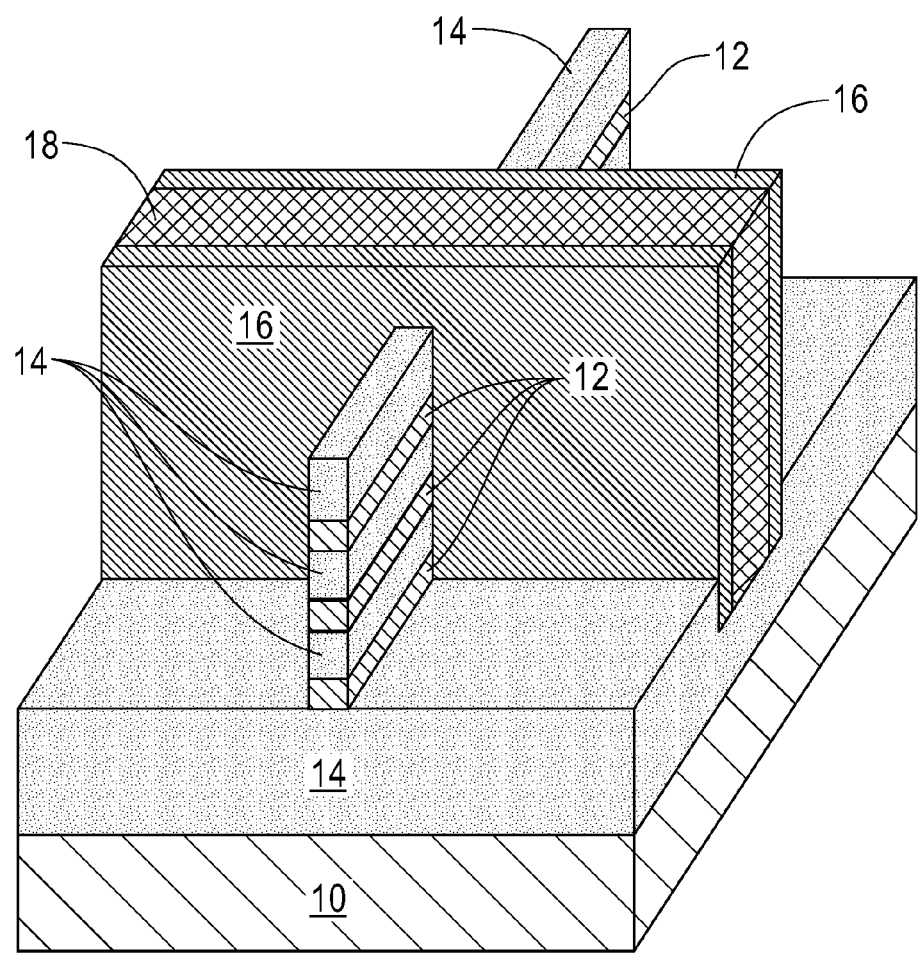
FIG. 1B is a perspective view of the exemplary semiconductor structure shown in FIG. 1A.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIGS. 1A and 1B, there are illustrated an exemplary semiconductor structure that can be employed in the present application. The exemplary semiconductor structure of FIGS. 1A and 1B includes a material sack of alternating layers of dielectric portions 14 and semiconductor material portions 12 located on a surface of a semiconductor substrate 10, wherein a sacrificial gate structure 18 and a gate spacer 16 straddling over a portion of the material stack. By "straddling" it is meant that a first portion of a first material is located on one side of a second material, and another portion of the first material is located on another side of the second material, and wherein yet a further portion of the first material is present above a topmost surface of the second material.

Although a single material stack and/or a single sacrificial gate structure is (are) shown and described, the present application is not limited to the same. Instead, one or more material stacks and/or one or more sacrificial gate structures can be formed. Also, the number of dielectric portions 14 and the number of semiconductor material portions 12 is not limited to four and three, respectively. Instead, any number of dielectric portions 14 and any number of semiconductor material portions 12 may be present in the material stack as long as each semiconductor material portion is sandwiched between a lower dielectric portion and an upper dielectric portion.

Each dielectric portion 14 includes a dielectric material such as, for example, an oxide, nitride or oxynitride. In one embodiment, each dielectric portion 14 is composed of silicon dioxide. The semiconductor substrate 10 may include any semiconductor material including, for example, silicon. The term "semiconductor material" is used throughout the present application to denote a material that has semiconducting properties. Besides silicon, the semiconductor material may be germanium (Ge), a silicon germanium alloy (SiGe), silicon carbide (SiC), silicon germanium carbide (SiGeC), III-V compound semiconductors or II-VI compound semiconductors. Each semiconductor material portion 12 may also comprise any semiconductor material including, for example, silicon. In some embodiments, the semiconductor material that provides each semiconductor material portion 12 is the same as the semiconductor material that provides the semiconductor substrate 10. In other embodiments, the semiconductor material that provides each semiconductor material portion 12 is different from the semiconductor material that provides the semiconductor substrate 10. The semiconductor substrate 10 may constitute a remaining portion of a bulk semiconductor substrate or a portion of a semiconductor-on-insulator substrate.

The exemplary semiconductor structure of FIGS. 1A and 1B can be formed utilizing processes that are well known in the art. For example, an initial material stack of a sacrificial semiconductor material such as a silicon germanium alloy and a semiconductor channel material such as silicon is formed on a surface of a bulk semiconductor substrate or a topmost surface of a semiconductor-on-insulator substrate. The initial material stack may be formed utilizing an epitaxial growth process. The initial material stack can then be patterned by lithography and etching. The sacrificial gate structure and the gate spacer as described below can then be formed. Next, each sacrificial semiconductor material is replaced with a dielectric material such as a flowable oxide. In some embodiments, the bottommost dielectric portion 14 that is formed has a thickness than is greater than the thickness of any of the overlying dielectric portions.

Each semiconductor material portion 12 has a vertical thickness of from 3 nm to 12 nm, and a width from 50 nm to 1000 nm. The vertical thickness of each dielectric portion 14 can be within a range from 6 nm to 30 nm, and the width of each dielectric portion 14 is the same as that of each semiconductor material portion 12.

The sacrificial gate structure 18 may include a single sacrificial material layer or a stack of two or more sacrificial materials (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of said sacrificial materials), lithography and etching can be used to pattern the sacrificial material stack (or any subset of said sacrificial materials) and to provide the sacrificial gate structure 18. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure, a gate spacer 16 can be formed on exposed sidewall surfaces of the sacrificial gate structure 18; the gate spacer 16 is formed around the entire sidewalls of the sacrificial gate structure 18. The gate spacer 16 can be formed by first providing a dielectric spacer material and then etching the dielectric spacer material. Examples of dielectric spacer materials that may be employed in the present application include dielectric oxides, dielectric nitrides and/or dielectric oxynitrides. The dielectric spacer material that provides the gate spacer 16 is a different dielectric material than each dielectric portion 14.

In one embodiment, the dielectric spacer material used in providing the gate spacer 16 is composed of silicon nitride. The dielectric spacer material may be provided by a deposition process including, for example, chemical vapor deposition (CVD), plasma enhanced chemical vapor deposition (PECVD), or physical vapor deposition (PVD). The etch used to provide the gate spacer 16 may comprise a dry etching process such as, for example, reactive ion etching.

Figure 2B:
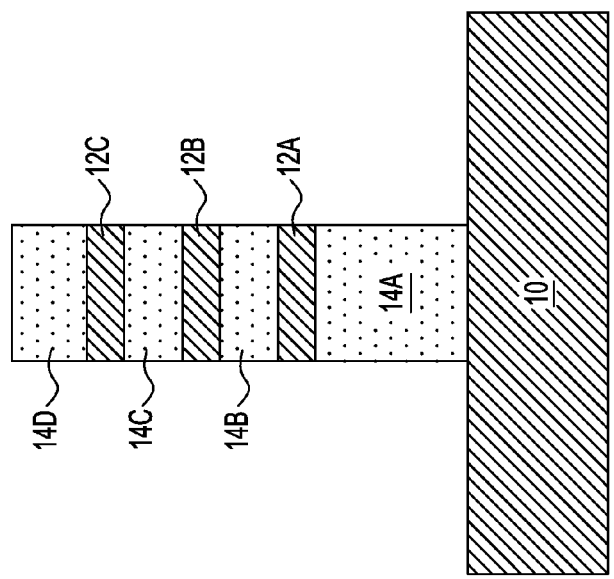
FIG. 2B illustrates the structure of FIG. 2A minus the gate spacer and the sacrificial gate structure.
Figure 2A:
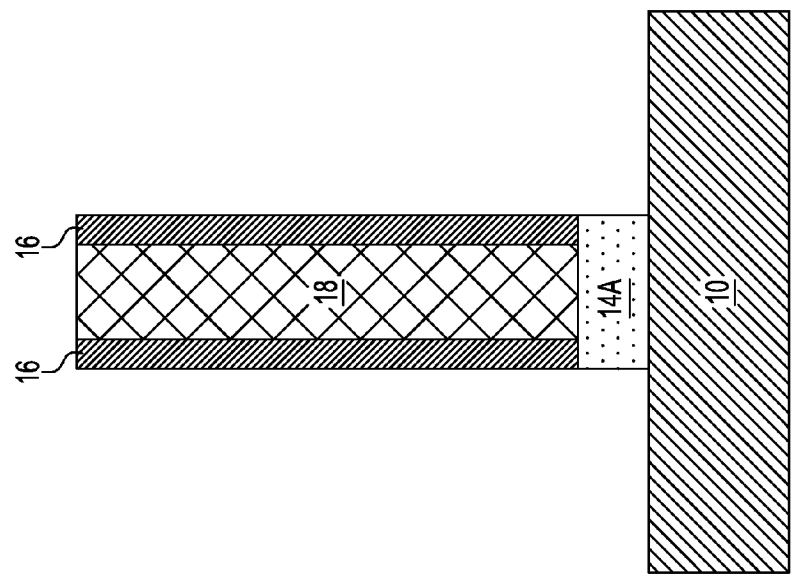
FIG. 2A is a cross sectional view of the exemplary semiconductor structure of FIG. 1A after removing portions of the material stack not covered by the gate spacer and the sacrificial gate structure to provide a stack of dielectric nanosheets and semiconductor nanosheets located on the surface of the semiconductor substrate.

Referring now to FIGS. 2A-2B, there are shown the exemplary semiconductor structure of FIG. 1A after removing portions of the material stack not covered by the gate spacer 16 and the sacrificial gate structure 18 to provide a stack of dielectric nanosheets (14A, 14B, 14C, 14D, etc) and semiconductor nanosheets (12A, 12B, 12C, etc.) located on the surface of the semiconductor substrate 10.

The removing of the portions of the material stack not covered by the gate spacer 16 and the sacrificial gate structure 18 can be performed utilizing an anisotropic etching process such as, for example, reactive ion etching (RIE).

Each dielectric nanosheet (14A, 14B, 14C, 14D, etc) comprises a remaining portion of the dielectric portions of the material stack shown in FIG. 1. Each semiconductor nanosheet (12A, 12B, 12C, etc.) comprises a remaining portion of each semiconductor material portion of the material stack shown in FIG. 1. At this point of the present application, each dielectric nanosheet (14A, 14B, 14C, 14D, etc) within the stack has outermost sidewalls that are vertically aligned with the outermost sidewalls of each semiconductor nanosheet (12A, 12B, 12C, etc.). Thus, each semiconductor nanosheet (12A, 12B, 12C, etc.) and each dielectric nanosheet (14A, 14B, 14C, 14D, etc) of the stack has a same width. In one embodiment, the width of each semiconductor nanosheet (12A, 12B, 12C, etc.) and each dielectric nanosheet (14A, 14B, 14C, 14D, etc) within the stack can be from 30 nm to 200 nm.

Referring now to FIGS. 3A-3B, there are shown the exemplary semiconductor structure of FIGS. 2A-2B after performing a crystallographic orientation dependent etch to form semiconductor nanosheets (12A, 12B, 12C, etc.) having a pair of end sidewalls that have a V-shaped undercut surface 13. By "V-shaped undercut surface" it is meant that that a groove is formed into the outermost surfaces of each semiconductor nanosheet (12A, 12B, 12C, etc.) by etching inwardly into each semiconductor nanosheet. In some embodiments of the present application, and when each semiconductor nanosheet (12A, 12B, 12C, etc.) comprises silicon, then the crystallographic orientation dependent etch may include etching in ammonia or trimethylammonium hydroxide (TMAH). In such an embodiment, the exposed end sidewalls that have a V-shaped undercut surface 13 have a $\{111\}$ crystal orientation.

During the crystallographic orientation dependent etch and in some embodiments of the present application, a portion of the semiconductor substrate 10 may be etched. In such an embodiment, a pedestal portion 10P of the semiconductor substrate 10 is presented directly beneath the stack and the pedestal portion 10P is located on a remaining portion of the semiconductor substrate (hereinafter labeled as 10'). In some embodiments, the remaining portion of the semiconductor substrate 10' that laterally adjoins the pedestal portion 10P has a topmost surface that is located beneath the topmost surface of the pedestal portion 10P. In some embodiments, the exposed topmost surface of the remaining portion of the semiconductor substrate 10' that laterally adjoins the pedestal portion 10P has a $\{100\}$ crystallographic orientation. In one embodiment, the remaining portion of the semiconductor substrate 10' and the pedestal portion 10P comprise silicon.

Referring now to FIG. 4A-4B, there are shown the exemplary semiconductor structure of FIGS. 3A-3B after epitaxially growing a source/drain (S/D) semiconductor material structure 20L, 20R on each side of the sacrificial gate structure 18 and from the V-shaped undercut surface 13 of each end sidewall of each semiconductor nanosheet (12A, 12B, 12C, etc).

In accordance with the present application, each source/drain (S/D) semiconductor material structure 20L, 20R includes a semiconductor material and a dopant. The semiconductor material that provides each S/D semiconductor material structure 20L, 20R can be selected from one of the semiconductor materials mentioned above for the semiconductor substrate 10. In some embodiments of the present application, the semiconductor material that provides each S/D semiconductor material structure 20L, 20R may comprise a same semiconductor material as that which provides each semiconductor nanosheet (12A, 12B, 12C, etc.). In other embodiments of the present application, the semiconductor material that provides each S/D semiconductor material structure 20L, 20R may comprise a different semiconductor material than that which provides each semiconductor nanosheet (12A, 12B, 12C, etc.). For example, the semiconductor material that provides each S/D semiconductor material structure 20L, 20R may comprise a silicon germanium alloy, while each semiconductor nanosheet (12A, 12B, 12C, etc.) may comprise silicon.

The dopant that is present in each S/D semiconductor material structure 20L, 20R can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each S/D semiconductor material structure 20L, 20R can be introduced into the precursor gas that provides each S/D semiconductor material structure 20L, 20R. In another embodiment, the dopant can be introduced into an intrinsic semiconductor layer by utilizing one of ion implantation or gas phase doping. In one example, each S/D semiconductor material structure 20L, 20R comprises a silicon germanium alloy that is doped with a p-type dopant such as, for example, boron.

As mentioned above, each source/drain (S/D) semiconductor material structure 20L, 20R is formed by an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, each source/drain (S/D) semiconductor material structure 20L, 20R has a bottommost surface that has an epitaxial relationship with the exposed, e.g., recessed, portion of the semiconductor substrate 10' and portions of the sidewall surfaces of each source/drain (S/D) semiconductor material structure 20L, 20R have an epitaxial relationship with the V-shaped undercut surface 13 of each semiconductor nanosheet (12A, 12B, 12C, etc).

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each source/drain (S/D) semiconductor material structure 20L, 20R, can be performed utilizing any well known precursor gas or gas mixture. Carrier gases like hydrogen, nitrogen, helium and argon can be used.

In some embodiments of the present application, a topmost portion of the remaining semiconductor substrate (including the pedestal portion 10P) may be doped to form a well region 11B that is present on a non-well region 11A. The formation of well region 11B occurs prior to forming each source/drain (S/D) semiconductor material structure 20L, 20R. The formation of the well region 11B can be performed by utilizing ion implantation or a gas phase doping process. In one example, the well region 11B is an n-well region.

Figure 5B:
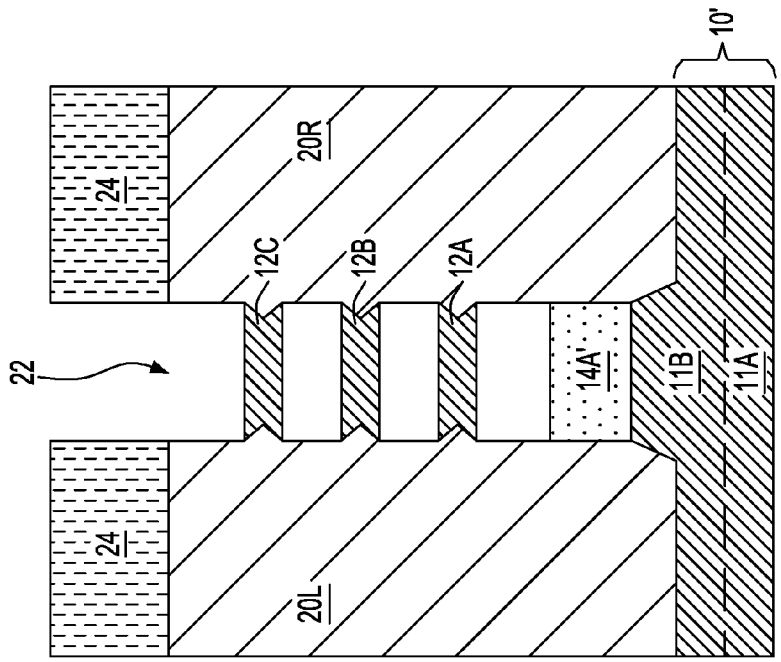
FIG. 5B illustrates the structure of FIG. 5A minus the gate spacer.
Figure 5A:
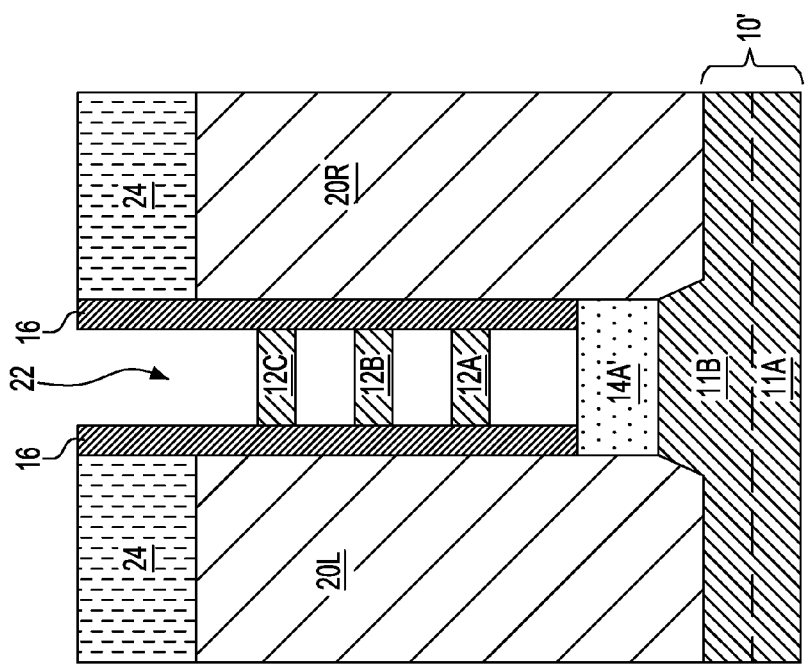
FIG. 5A is a cross sectional view of the exemplary semiconductor structure of FIG. 4A after forming a middle-of-the-line (MOL) dielectric material on a surface of each S/D semiconductor material structure, removing the sacrificial gate structure to provide a gate cavity, and suspending each semiconductor nanosheet within the gate cavity.

Referring now to FIGS. 5A-5B, there are shown the exemplary semiconductor structure of FIGS. 4A-4B after forming a middle-of-the-line (MOL) dielectric material 24 on a surface of each S/D semiconductor material structure 20L, 20R, removing the sacrificial gate structure 18 to provide a gate cavity 22 and suspending each semiconductor nanosheet (12A, 12B, 12C, etc) within the gate cavity 22.

After formation of the MOL dielectric material 24 and prior to removing the sacrificial gate structure 18, the MOL dielectric material 24 has a topmost surface that is coplanar with a topmost surface of the gate spacer 16 and a topmost surface of the sacrificial gate structure 18. MOL dielectric material 24 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 24. The use of a self-planarizing dielectric material as the MOL dielectric material 24 may avoid the need to perform a subsequent planarizing step.

In one embodiment, the MOL dielectric material 24 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 24, a planarization process or an etch back process follows the deposition of the dielectric material that provides the MOL dielectric material 24. The thickness of the dielectric material that provides the MOL dielectric material 24 may vary depending on the type of dielectric material employed as well as the method that was employed in forming the same. In one embodiment, the dielectric material used to provide the MOL dielectric material 24 has a thickness from 80 nm to 500 nm. Other thicknesses that are greater or lesser than the range provided above can also be used for the dielectric material that provides the MOL dielectric material 24.

After providing the MOL dielectric material 24, the sacrificial gate structure 18 is removed to provide the gate cavity 22. The removal of the sacrificial gate structure 18 can be performed utilizing one or more anisotropic etching processes that is selective in removing the material (or materials) that provide the sacrificial gate structure 18 relative to the MOL dielectric 24, gate spacer 16 and each semiconductor nanosheet (12A, 12B, 12C, etc).

The suspending of each semiconductor nanosheet (12A, 12B, 12C, etc) within the gate cavity 22 may be performed by selectively etching each dielectric nanosheet (14A, 14B, 14C, 14D, etch) relative to each semiconductor nanosheet (12A, 12B, 12C, etc). In some embodiments, and since the bottommost dielectric nanosheet is thicker that the other dielectric nanosheets that overlying the bottommost dielectric nanosheet, a portion of the bottommost dielectric nanosheet may remain. The remaining portion of the bottommost dielectric nanosheet is referred to herein as a dielectric nanosheet base portion 14A'. As is shown, the dielectric nanosheet base portion 14A' is located directly on the pedestal portion 10P of the semiconductor substrate 10'.

As is further shown, the dielectric nanosheet base portion 14A' is spaced apart from a bottommost semiconductor nanosheet (i.e., 12A) by a gap.

Figure 6A:
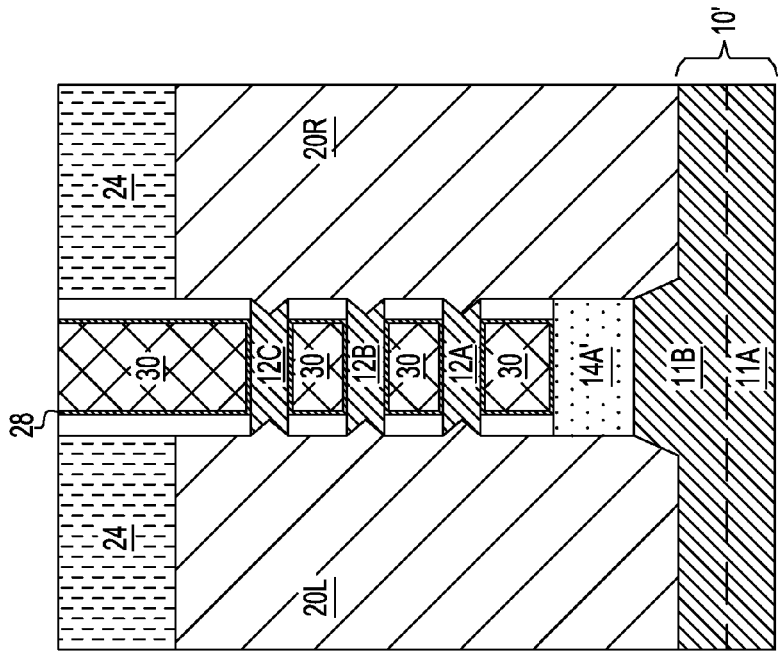
FIG. 6A is a cross sectional view of the exemplary semiconductor structure of FIG. 5A after forming a functional gate structure in the gate cavity and surrounding each suspended semiconductor nanosheet.
Figure 6B:
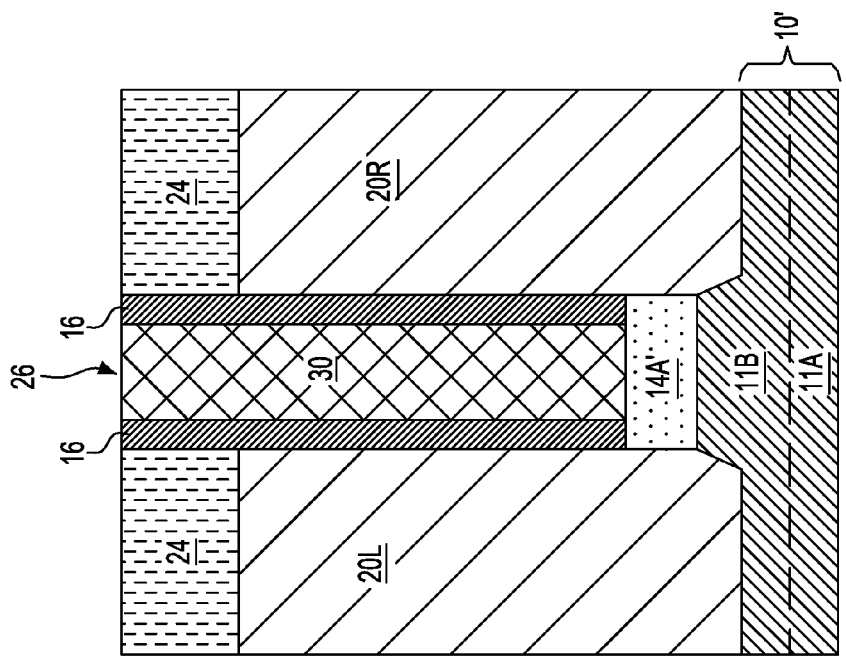
FIG. 6B illustrates another view of the exemplary semiconductor structure of FIG. 6A minus the gate spacer.

Referring now to FIGS. 6A-6B, there are shown the exemplary semiconductor structure of FIGS. 5A-5b after forming a functional gate structure 26 in the gate cavity 22 and surrounding a portion (i.e., a channel portion) of each suspended semiconductor nanosheet (12A, 12B, 12C, etc). By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed.

The functional gate structure 26 may include a gate dielectric portion 28 and a gate conductor portion 30. The gate dielectric portion 28 may include a gate dielectric material. The gate dielectric material that provides the gate dielectric portion 28 can be an oxide, nitride, and/or oxynitride. In one example, the gate dielectric material that provides the gate dielectric portion 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 28.

The gate dielectric material used in providing the gate dielectric portion 28 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 28 can have a thickness in a range from 1 nm to 10 nm. Other thicknesses that are lesser than, or greater than, the aforementioned thickness range can also be employed for the gate dielectric material that may provide the gate dielectric portion 28.

The gate conductor portion 30 can include a gate conductor material. The gate conductor material used in providing the gate conductor portion 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 30 may comprise an nFET gate metal. In another embodiment, the gate conductor portion 30 may comprise a pFET gate metal.

The gate conductor material used in providing the gate conductor portion 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 30 can have a thickness from 50 nm to 200 nm. Other thicknesses that are lesser than, or greater than, the aforementioned thickness range can also be employed for the gate conductor material used in providing the gate conductor portion 30.

The functional gate structure 26 can be formed by providing a functional gate material stack of the gate dielectric material, and the gate conductor material. A planarization process may follow the formation of the functional gate material stack.

Notably, FIGS. 6A-6B illustrate the semiconductor structure in accordance with the present application. The semiconductor structure includes a plurality of stacked and suspended semiconductor nanosheets (12A, 12B, 12C, etc) located above a semiconductor structure 10'. In accordance with the present application, each semiconductor nanosheet (12A, 12B, 12C, etc) has a pair of end sidewalls 13 that have a V-shaped undercut surface 13. The semiconductor structure further includes a functional gate structure 26 surrounding a portion of each semiconductor nanosheet of the plurality of stacked and suspended semiconductor nanosheets (12A, 12B, 12C, etc), and a source/drain semiconductor material structure 20L, 20R located on each side of the functional gate structure 26. In accordance with the present application, sidewall portions of each S/D semiconductor material structure 20L, 20R are in direct contact with the V-shaped undercut surface 13 of each of the semiconductor nanosheets (12A, 12B, 12C, etc.).

In some embodiments, the V-shaped undercut surface 13 provided to the end sidewalls of each semiconductor nanosheet (12A, 12B, 12C, etc.) can enhance strain and bring the dopants within each S/D semiconductor material structure (20L, 20R) closer to the device channel region, i.e., the portion of each semiconductor nanosheet that is surrounded by the functional gate structure 26. In some embodiments, each S/D semiconductor material structure 20L, 20R may be grown from a surface of the semiconductor substrate 10' that has a {100} crystallographic orientation. In such an embodiment, each S/D semiconductor material structure 20L, 20R may have reduced epitaxy defect density and improved strain.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:

providing a material stack of dielectric layers alternating with semiconductor layers on a surface of a semiconductor substrate, wherein each semiconductor layer comprises a semiconductor channel material having semiconducting properties and is located between a lower one of said dielectric layers and an upper one of said dielectric layers of said material stack, and wherein a sacrificial gate structure and a gate spacer straddle over and cover a first portion of said material stack;

removing, utilizing an anisotropic etch, a second portion of said material stack other than said first portion and not covered by said gate spacer and said sacrificial gate structure to physically expose said semiconductor substrate and to provide a modified stack of dielectric nanosheets alternating with semiconductor nanosheets, wherein each dielectric nanosheet comprises a remaining portion of a respective one of said dielectric layers and each semiconductor nanosheet comprises a remaining portion of a respective one of said semiconductor layers, wherein outermost sidewalls of each dielectric nanosheet are vertically aligned with outermost sidewalls of each semiconductor nanosheet, respectively, and wherein said modified stack of said dielectric nanosheets and said semiconductor nanosheets does not extend beyond outermost sidewalls of said gate spacer;

performing a crystallographic orientation dependent etch on each semiconductor nanosheet to provide a pair of opposing sidewalls to each semiconductor nanosheet, each sidewall of said pair of opposing sidewalls having a V-shaped undercut surface; and epitaxially growing a source/drain (S/D) semiconductor layer from said semiconductor substrate at a first side and a second side opposite to said first side of said sacrificial gate structure and from said V-shaped undercut surface of each sidewall of said pair of opposing sidewalls of each semiconductor nanosheet.

2. The method of claim 1, further comprising:
forming a middle-of-the-line (MOL) dielectric material on a surface of said S/D semiconductor layer;
removing said sacrificial gate structure to provide a gate cavity; and
suspending each semiconductor nanosheet within said gate cavity.

3. The method of claim 2, further comprising:
forming a functional gate structure in said gate cavity and surrounding a portion of each suspended semiconductor nanosheet.

4. The method of claim 1, wherein said crystallographic orientation dependent etch recesses a portion of said semiconductor substrate not covered by said gate spacer and said sacrificial gate structure.

5. The method of claim 1, wherein said S/D semiconductor layer comprises a different semiconductor material than each of said semiconductor nano sheets.

6. The method of claim 1, wherein said S/D semiconductor layer comprises a silicon germanium alloy and each of said semiconductor nanosheets comprises silicon.

7. The method of claim 6, wherein said pair of opposing sidewalls having said V-shaped undercut surface have a {111} crystallographic orientation.

8. The method of claim 6, wherein said silicon germanium alloy contains a p-type dopant.

9. The method of claim 2, wherein after said suspending each semiconductor nanosheet, a dielectric nanosheet base portion is formed beneath a bottommost one of said semiconductor nanosheets.

10. The method of claim 1, wherein said S/D semiconductor layer is also formed from a recessed surface of said semiconductor substrate, said recessed surface of said semiconductor substrate having a {100} crystallographic orientation.

11. The method of claim 1, wherein said providing said material stack comprises:
forming an initial stack of layers of a sacrificial semiconductor material and layers of said semiconductor channel material;
patterning said initial stack; and
replacing said sacrificial semiconductor material with a dielectric material.

* * * * *